(12) United States Patent
Daruwalla et al.

(10) Patent No.: US 11,533,042 B2
(45) Date of Patent: Dec. 20, 2022

(54) DISTRIBUTED-MODE BEAM AND FRAME RESONATORS FOR HIGH FREQUENCY TIMING CIRCUITS

(71) Applicant: Georgia Tech Research Corporation, Atlanta, GA (US)

(72) Inventors: Anosh Daruwalla, Atlanta, GA (US); Farrokh Ayazi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 944 days.

(21) Appl. No.: 16/249,749

(22) Filed: Jan. 16, 2019

(65) Prior Publication Data

US 2019/0222196 A1    Jul. 18, 2019

Related U.S. Application Data

(60) Provisional application No. 62/617,850, filed on Jan. 16, 2018.

(51) Int. Cl.
*H03H 9/15*    (2006.01)
*H03H 9/02*    (2006.01)
(Continued)

(52) U.S. Cl.
CPC ........ *H03H 9/2447* (2013.01); *H03H 3/0077* (2013.01); *H03H 9/02259* (2013.01); *H03H 9/02448* (2013.01); *H03H 9/2431* (2013.01); *H03H 2009/02291* (2013.01); *H03H 2009/02496* (2013.01); *H03H 2009/155* (2013.01)

(58) Field of Classification Search
CPC .. H03H 3/0072; H03H 3/0076; H03H 3/0077; H03H 3/0078; H03H 2003/027; H03H 9/02244; H03H 9/02259; H03H 9/02448; H03H 9/17; H03H 9/172; H03H 9/176; H03H 9/2405; H03H 9/2447; H03H 9/2452; H03H 9/2457; H03H 9/2463; H03H 2009/02251; H03H 2009/02283; H03H 2009/02291; H03H 2009/02496; H03H 2009/155

See application file for complete search history.

(56) References Cited

U.S. PATENT DOCUMENTS 5,361,045 A  *  11/1994  Beaussier ............. H03H 9/125
                                                       310/368
7,598,656 B2 *  10/2009  Wischnewskij ....... H02N 2/026
                                                       310/323.01
(Continued)

*Primary Examiner* — Levi Gannon
(74) *Attorney, Agent, or Firm* — Troutman Pepper Hamilton Sanders LLP; Ryan A. Schneider

(57) ABSTRACT

Embodiments of the present disclosure relate generally to MEMS resonators. An exemplary MEMS resonator comprises a resonator beam having a length and a width. The length can be an integer multiple of the width. The integer multiple can be at least two. The resonator is configured to resonate at a frequency upon application of an input signal. The TCF of this resonator can be made close to zero, thus providing a temperature stable resonator. The exemplary MEMS resonator thereby has the advantages of high Q, low polarization voltage, low motional impedance and temperature stability of low frequency resonators while being able resonate at high frequencies of 30 MHz to 30 GHz.

20 Claims, 10 Drawing Sheets

(51) Int. Cl.
*H03H 9/24* (2006.01)
*H03H 3/007* (2006.01)

(56) References Cited

U.S. PATENT DOCUMENTS

| | | | |
|---|---|---|---|
| 9,712,136 B2 | 7/2017 | Rinaldi et al. | |
| 9,742,373 B2 | 8/2017 | Raieszadeh et al. | |
| 10,056,877 B2 | 8/2018 | Jaakkola et al. | |
| 10,931,255 B2* | 2/2021 | Jaakkola | H03H 9/1057 |
| 2004/0150398 A1* | 8/2004 | Champion | H03H 9/02259 |
| | | | 331/65 |
| 2006/0273867 A1* | 12/2006 | Piazza | H03H 9/172 |
| | | | 333/189 |
| 2011/0221301 A1* | 9/2011 | Hentz | G01C 19/56 |
| | | | 310/309 |
| 2011/0279201 A1* | 11/2011 | Pensala | H03H 9/2436 |
| | | | 333/219.1 |
| 2012/0286903 A1* | 11/2012 | Prunnila | H03H 9/2447 |
| | | | 716/110 |
| 2013/0002364 A1* | 1/2013 | Quevy | H03H 9/2457 |
| | | | 331/156 |
| 2016/0099703 A1* | 4/2016 | Jaakkola | H03H 9/2447 |
| | | | 310/300 |
| 2018/0019728 A1 | 1/2018 | Kaajakari | |
| 2018/0138889 A1 | 5/2018 | Rinaldi et al. | |
| 2018/0175825 A1* | 6/2018 | Kaajakari | H03H 9/02275 |
| 2018/0287047 A1* | 10/2018 | Rinaldi | H01L 41/107 |
| 2019/0181830 A1* | 6/2019 | Xu | H03H 9/02228 |
| 2021/0135626 A1* | 5/2021 | Oja | H03B 5/04 |

* cited by examiner

DISTRIBUTED-MODE BEAM AND FRAME RESONATORS FOR HIGH FREQUENCY TIMING CIRCUITS

CROSS-REFERENCE TO RELATED APPLICATIONS

This Applications claims priority to U.S. Provisional Patent Application No. 62/617,850, filed 16 Jan. 2018, which is hereby incorporated by reference herein in its entirety as if fully set forth below.

STATEMENT OF RIGHTS UNDER FEDERALLY SPONSORED RESEARCH

This invention was made with government support under Contract No. N66001-11-C-4176 awarded by Space and Naval Warfare Systems Command. The government has certain rights in the invention.

FIELD OF THE DISCLOSURE

Embodiments of the present disclosure relate generally to resonators and, more particularly, to distributed multi-unit resonators operating in a Lamé mode.

BACKGROUND

Silicon microelectromechanical system (MEMS) timing resonators have drawn a great amount of attention during the past two decades due to their small size, low cost, and integration compatibility. However, silicon resonator timing elements still have not been able to replace their quartz counterpart in many applications. One major bottleneck for silicon MEMS resonators is the lack of temperature stability at high resonance frequencies.

Over the past couple decades, many alternative configurations and designs have been employed to overcome these temperature-stability deficiencies. One increasingly popular design is the square Lamé mode silicon resonator, a design with a great degree of temperature stability. This temperature stability in the Lamé mode is owed to its quadratic temperature coefficient of frequency ("TCF") profile. Lamé mode silicon resonators also provide the benefit of a high quality factor ("Q factor"), which can be over one million. However, Lamé mode silicon resonators have an additional drawback: low operational frequency. Current Lamé mode silicon resonators operate in the order of 10s of MHz.

One way to increase the operational frequency of square Lamé mode silicon resonators is to decrease their width. However, reducing the width of a Lamé mode silicon resonator also increases the motional impedance and decreases the transduction area of the system. What is needed, therefore, is a system that provides high temperature stability and a high frequency-Q ("f-Q") product without sacrificing transduction area or increasing motional impedance.

SUMMARY

Embodiments of the present disclosure address these concerns as well as other needs that will become apparent upon reading the description below in conjunction with the drawings. Briefly described, embodiments of the present disclosure relate generally resonators and, more particularly, to multi-unit resonators operating in a Lamé mode.

An exemplary embodiment of the present invention provides a MEMS resonator comprising a first resonator beam. The first resonator beam has a length and a width, in which the length is an integer multiple of the width of at least two. The resonator is configured to resonate at a frequency upon application of an input signal.

In any of the embodiments described herein, the resonator can further comprise a first plurality of electrically-coupled electrodes periodically-spaced about one of a first side and a second side of the first resonator beam. The length of the periodic space between adjacent electrodes in the first plurality of electrodes can be equal to about the width of the first resonating beam.

In some of the embodiments described herein, no electrode in the first plurality of electrodes has a length greater than the width of the first resonator beam.

In any of the embodiments described herein, the resonator can further comprise a capacitive gap between each of the electrically-coupled electrodes and the first resonator beam.

In any of the embodiments described herein, the capacitive gap can be smaller than 400 nanometers.

In any of the embodiments described herein, the resonator can further comprise a second plurality of electrically-coupled electrodes periodically-spaced about the one of a first side and a second side of the first resonator beam. The length of the periodic space between adjacent electrodes in the second plurality of electrodes can be equal to about the width of the first resonating beam. The second plurality of electrically-coupled electrodes can be electrically isolated from the first plurality of electrically-coupled electrodes.

In some of the embodiments described herein, no electrode in the second plurality of electrodes has a length greater than the width of the first resonator beam.

In any of the embodiments described herein, the resonator can further comprise a second resonator beam having a length and a width, in which the length can be an integer multiple of the width of at least two. The second resonator beam can be mechanically-coupled to the first resonator beam.

In any of the embodiments described herein, the resonator can further comprise a third resonator beam having a length and a width, in which the length can be an integer multiple of the width of at least two. The third resonator beam can be mechanically-coupled to the second resonator beam.

In any of the embodiments described herein, the resonator can further comprise a fourth resonator beam having a length and a width, such that the length being an integer multiple of the width, the integer multiple being at least two, the fourth resonator beam mechanically-coupled to the first and third resonator beams.

In any of the embodiments described herein, the first, second, third, and fourth resonator beams are arranged in a rectangle or square shape.

In any of the embodiment described herein, the first, second, third, and fourth resonator beams are arranged in a rectangular or square shape.

In any of the embodiment described herein, the first, second, third, and fourth resonator beams are arranged in a rectangular or square shape.

In any of the embodiment described herein, the first, second, third, and fourth resonator beams are arranged in a square-shape.

In any of the embodiments described herein, the resonator can further comprise a plurality of anchors positioned about corners of the resonator. The anchors can mechanically-couple the resonator to a substrate.

In any of the embodiments described herein, the width of the first resonator beam can be equal to $$\frac{1}{f\sqrt{2}}v,$$

wherein f is equal to the frequency and v is equal to the acoustic velocity of the elastic shear wave travelling through the body of the resonator.

In any of the embodiments described herein, the first resonator beam can comprise a plurality of resonant units. Each resonant unit can have a length and a width. The length and the width can each be equal to the width of the first resonator beam. Each resonant unit can be configured to resonate in a lame mode at the frequency upon application of the input signal.

In any of the embodiments described herein, the resonator can have a quality factor of between 10,000 and 10,000,000.

In any of the embodiments described herein, the frequency can be between 30 MHz and 10 GHz.

In any of the embodiments described herein, the first resonator beam can comprise at least one of poly or mono-crystalline silicon, poly or mono-crystalline silicon carbide, poly or mono-crystalline diamond, silicon dioxide, silicon nitride, poly or mono-crystalline germanium, and glass.

In any of the embodiments described herein, the resonator can exhibit a turn-over point in its frequency versus temperature characteristic between minus 100 to positive 200 degrees centigrade. A turn-over point is the point on the frequency versus temperature curve where the slope of the curve (TCF) is zero.

In any of the embodiments described herein, the first resonator beam can be rectangular-shaped.

Another exemplary embodiment of the present invention provides a MEMS resonator comprising a first resonator beam and a first plurality of electrically-coupled electrodes. The first resonator beam has a length and width, in which the length is an integer multiple of the width of at least three. The first resonator beam can form a first plurality of resonant units, each having a length and width. Both the length and the width of each of the first plurality of resonant units can be equal to the width of the first resonator beam. The first plurality of electrically-coupled electrodes can be periodically-spaced about one of a first side and a second side of the first resonator beam. Each of the first plurality of electrically-coupled electrodes can have a length less than or equal to a width of the first resonating beam. Each of the first plurality of resonator units can be configured to resonate in a lame mode at a frequency upon application of an input signal to the resonator.

In any of the embodiments described herein, the resonator can further comprise a second resonator beam and a second plurality of electrically-coupled electrodes. The second resonator beam can have a length and a width, in which the length is an integer multiple of the width of at least three. The second resonator beam can form a second plurality of resonant units having a length and width, in which both the length and the width of each of the second plurality of resonant units is equal to the width of the second resonator beam. The second plurality of electrically-coupled electrodes can be periodically-spaced about one of a first side and a second side of the second resonator beam. Each of the second plurality of electrically-coupled electrodes can have a length less than or equal to a width of the second resonating beam. A first end of the first resonator beam can be mechanically-coupled to a first end of the second resonator beam, such that the first and second resonator beams are arranged non-linearly with respect to each other. Each of the first plurality of resonator units and each of the second plurality of resonator units can be configured to resonate in a lame mode at a frequency upon application of an input signal to the resonator.

In any of the embodiments described herein, the first plurality of electrically-coupled electrodes can be electrically-coupled to the second plurality of electrically-coupled electrodes.

In any of the embodiments described herein, the resonator can further comprise a third resonator beam, a third plurality of electrically-isolated electrodes, a fourth resonator beam, and a fourth plurality of electrically-isolated electrodes. The third resonator beam can have a length and a width, in which the length is an integer multiple of the width of at least three. The third resonator beam can form a third plurality of resonant units having a length and width, in which both the length and the width of each of the third plurality of resonant units is equal to the width of the third resonator beam. The third plurality of electrically-coupled electrodes can be periodically-spaced about one of a first side and a second side of the third resonator beam. Each of the third plurality of electrically-coupled electrodes can have a length less than or equal to a width of the third resonating beam. The fourth resonator beam can have a length and a width, in which the length is an integer multiple of the width of at least three. The fourth resonator beam can form a fourth plurality of resonant units having a length and width, in which both the length and the width of each of the fourth plurality of resonant units is equal to the width of the fourth resonator beam. The fourth plurality of electrically-coupled electrodes can be periodically-spaced about one of a first side and a second side of the fourth resonator beam. Each of the fourth plurality of electrically-coupled electrodes can have a length less than or equal to a width of the fourth resonating beam. A first end of the third resonator beam can be mechanically-coupled to a second end of the second resonator beam. A first end of the fourth resonator beam can be mechanically-coupled to a second end of the third resonator beam. A second end of the fourth resonator beam can be mechanically-coupled to a second end of the first resonator beam. The first, second, third, and fourth resonator beams can be arranged in a rectangular or square shape. Each of the first, second, third, and fourth pluralities of resonator units can be configured to resonate in a lame mode at a frequency upon application of an input signal to the resonator.

In any of the embodiments described herein, the first, second, third, and fourth pluralities of electrically-coupled electrodes can be electrically-coupled to each other.

These and other aspects of the present disclosure are described in the Detailed Description below and the accompanying figures. Other aspects and features of embodiments of the present disclosure will become apparent to those of ordinary skill in the art upon reviewing the following description of specific, example embodiments of the present disclosure in concert with the figures. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments of the disclosure discussed herein. In similar fashion, while example embodiments may be discussed below as device, system, or method embodiments, it is to be understood that such example embodiments can be implemented in various devices, systems, and methods of the present disclosure.

BRIEF DESCRIPTION OF THE FIGURES

The patent or application file contains at least one drawing executed in color. Copies of this patent or patent application publication with color drawing(s) will be provided by the Office upon request and payment of the necessary fee.

Reference will now be made to the accompanying figures and diagrams, which are not necessarily drawn to scale, and wherein.

DETAILED DESCRIPTION

Figure 1:
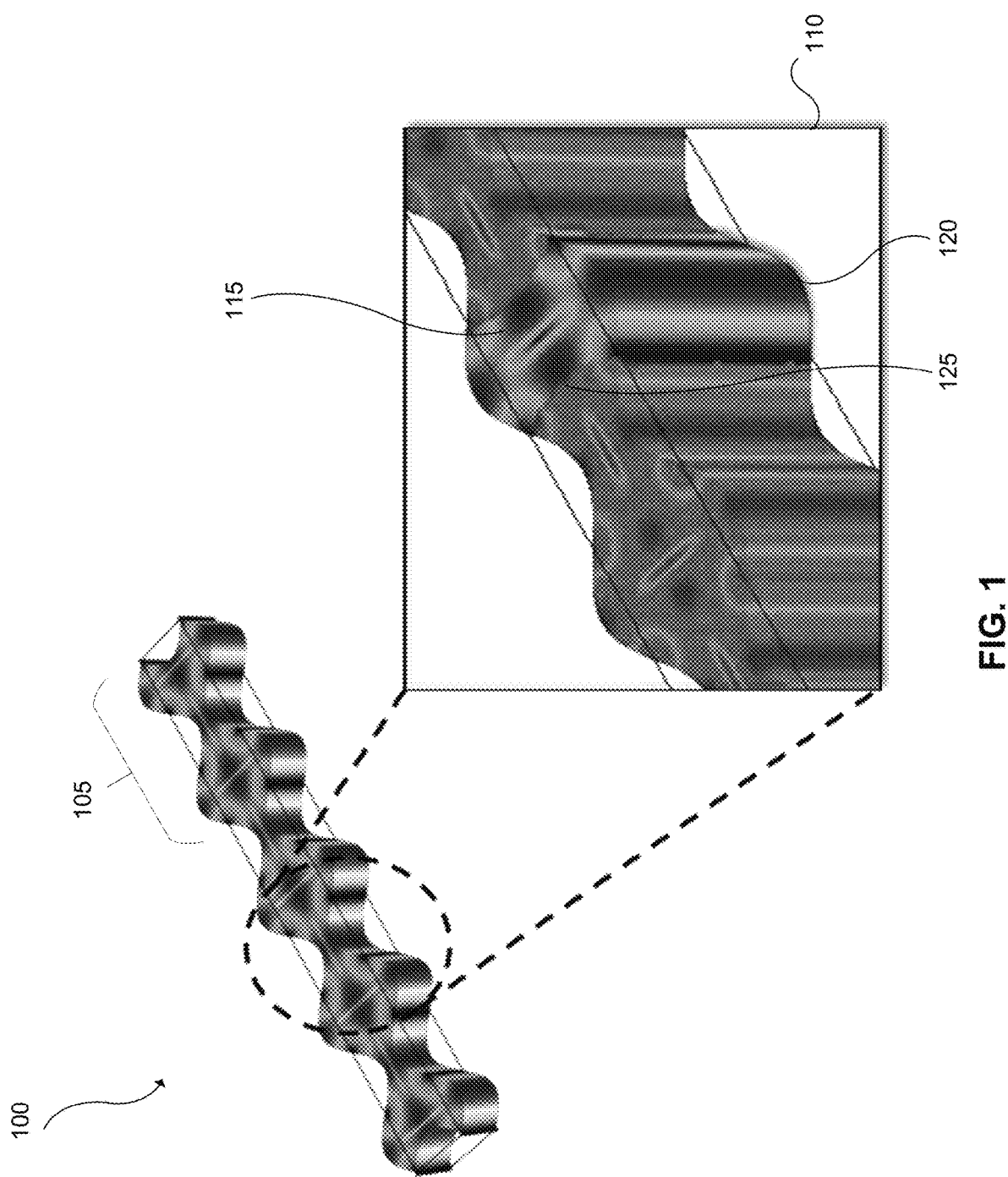
FIG. 1 depicts a propagating train of Lamé modes along the length of a resonator, according to an exemplary embodiment of the present disclosure.

Although certain embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. Other embodiments of the disclosure are capable of being practiced or carried out in various ways. Also, in describing the embodiments, specific terminology will be resorted to for the sake of clarity. It is intended that each term contemplates its broadest meaning as understood by those skilled in the art and includes all technical equivalents which operate in a similar manner to accomplish a similar purpose.

It should also be noted that, as used in the specification and the appended claims, the singular forms "a," "an" and "the" include plural references unless the context clearly dictates otherwise. References to a composition containing "a" constituent is intended to include other constituents in addition to the one named.

Ranges may be expressed herein as from "about" or "approximately" or "substantially" one particular value and/ or to "about" or "approximately" or "substantially" another particular value. When such a range is expressed, other exemplary embodiments include from the one particular value and/or to the other particular value.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required.

The components described hereinafter as making up various elements of the disclosure are intended to be illustrative and not restrictive. Many suitable components that would perform the same or similar functions as the components described herein are intended to be embraced within the scope of the disclosure. Such other components not described herein can include, but are not limited to, for example, similar components that are developed after development of the presently disclosed subject matter. Additionally, the components described herein may apply to any other component within the disclosure. Merely discussing a feature or component in relation to one embodiment does not preclude the feature or component from being used or associated with another embodiment.

To facilitate an understanding of the principles and features of the disclosure, various illustrative embodiments are explained below. In particular, the presently disclosed subject matter is described in the context of being distributed Lamé mode silicon resonators. The present disclosure, however, is not so limited and can be applicable in other contexts. For example, and not limitation, some embodiments of the present disclosure may improve the functionality of acoustic resonators comprised of other materials, including but not limited to poly or mono-crystalline silicon, poly or mono-crystalline silicon carbide, poly or mono-crystalline diamond, silicon dioxide, silicon nitride, poly or mono-crystalline germanium, and glass. Additionally, some embodiments of the present disclosure may improve resonators in a variety of shapes, at a variety of temperatures, and at a variety of resonance frequencies. These embodiments are contemplated within the scope of the present disclosure. Accordingly, when the present disclosure is described in the context of a distributed Lamé mode silicon resonator, it will be understood that other embodiments can take the place of those referred to.

As described above, conventional silicon MEMS resonators require a tradeoff between optimal temperature stability, high f-Q product, large transduction area, and low motional impedance. Current silicon MEMS resonators rely heavily on the shape and configuration of the system to increase the optimal output of the device. As described above, one popular method to increase the f-Q product and maintain temperature stability is to use square Lamé mode silicon resonators. Lamé mode silicon resonators exhibit good temperature stability due to their quadratic TCF profile. In other words, temperature stability in a square Lamé mode resonator is achieved by ovenizing a highly-doped Lamé mode at its turnover point with a resonance frequency at or below 10 MHz.

However, although square Lamé mode silicon resonators produce a high f-Q product, they obtain this not from a high operational frequency but instead from their high Q factor. Conventional square Lamé mode silicon resonators operate in the range of 10 MHz or less, and they may exhibit a Q factor above one million. One way to increase the low operational frequency is to decrease the width of the resonator beam. The frequency f of a square Lamé mode resonator in monocrystalline silicon aligned to the <100> direction is given by:

$$f = \frac{1}{\sqrt{2} \cdot W} \cdot \sqrt{\frac{c_{11} - c_{12}}{2\rho}} \qquad \text{Equation 1}$$

Here, W is the width of the resonator, $c_{11}$ and $c_{12}$ are primary elastic constants of silicon, and $\rho$ is the density of silicon. As can be seen, to achieve a high frequency output, the width of the square Lamé mode resonator must be small. Decreasing the width of the device, however, also increases the motional impedance and decreases the transduction area of the system. For example, the motion impedance $R_m$ of a square Lamé mode is given by:

$$R_m \propto \frac{g^4}{QV_p^2 tW} \propto \frac{f}{QV_p^2} \qquad \text{Equation 2}$$

Here, Q is the quality factor, t is the device thickness, g is the capacitive gap size, and $V_p$ is the polarization voltage. As can be seen, decreasing the width of the system also increases the motional impedance $R_m$. Consequently, the rapid increase in motional impedance prevents one from up-scaling the operational frequency, which highly limits the resonator's application. Another way to compensate for the low frequency of conventional square Lamé mode resonators is to provide up-converting frequency synthesizers, but this method also leads to additional phase noise and larger power consumption.

The present disclosure provides a novel resonator design that makes use of the in-plane shear nature of Lamé mode, but instead the mode is distributed across a beam using a plurality of square Lamé modes. In particular, the present disclosure discusses various designs of a distributed Lamé mode resonator ("DLR") that produces a train of propagating Lamé modes along an elongated beam. Distributing a plurality of square Lamé modes across an elongated beam overcomes the disadvantages of traditional single-square Lamé mode resonators. For example, elongating the device and including a plurality of spaced electrodes inherently increases the transduction area. Additionally, the motional impedance $R_m$ of the DLR is less than that of a conventional square Lamé mode resonator. For a DLR with N electrode-pair-digits, the motional impedance $R_m$ is given by:

$$R_m \propto \frac{g^4}{QV_p^2 \frac{N}{2} tW} \propto \frac{2}{N} \frac{f}{QV_p^2} \qquad \text{Equation 3}$$

The number of electrode-pair-digits is divided by a factor of 2, considering the DLR has one electrode pair for every other distributed element compared to two electrode pairs for one traditional square Lamé mode resonator. Comparing Equation 3 (impedance for a DLR) with Equation 2 (impedance for a conventional square Lamé mode), it can be seen that the inverse relationship between width and frequency can be compensated for by extending the resonator length and increasing the number of electrode-digits. This shows that the decoupling of width and length offers design freedom to scale the frequency without compromising transduction efficiency.

Various devices and methods are disclosed for providing a DLR with a series of electrode pairs, and exemplary embodiments of the devices and methods will now be described with reference to the accompanying figures.

FIG. 1 depicts how a distributed Lamé mode resonator ("DLR") 100 may take advantage of a propagating train of Lamé modes 105 along the length of the DLR 100, in accordance with some embodiments of the present disclosure. In typical acoustic wave resonators, primary (P-wave) or secondary (S-wave) elastic waves travelling through the resonator beam reach the resonator beam-air interface and reflect back to form a combination of P and S waves, a phenomenon also called mode conversion. However, in the special case wherein an S-wave is incident to the boundary at 45° (as is the case in Lamé mode), there will be no wave conversion and only S-waves are reflected. The pure S-wave nature of Lamé mode indicates that a series of Lamé modes can result from a propagating train of S-waves at 45°.

In a conventional square Lamé mode resonator, the square resonator responds to an excitation force by expanding in one direction and contracting in the perpendicular direction. As seen in FIG. 1, certain embodiments of the present disclosure take advantage of this Lamé-mode characteristic by alternating the expanded/contracted state across a plurality of square Lamé modes. For example, the inset blow-up 110 in FIG. 1 depicts a single distributed element (i.e., a single Lamé mode 115). In this disclosure, the phrases "single distributed element" and "single resonant unit" refer to a single Lamé mode 115. As shown, the single Lamé mode 115 has an expanded axis 120 and a contracted axis 125 when resonating. For a DLR 100 exhibiting a propagating train of Lamé modes 105, one can easily see an opposite Lamé mode is present on each side of the single Lamé mode 115. In other words, if the single Lamé mode 115 was rotated 90°, the rotated Lamé mode could fit on either side of the single Lamé mode 115, thus continuing the train of alternating Lamé modes. This feature of an DLR 100 provides benefits over previous systems attempting to harvest the benefit of multiple Lamé mode resonators, such as previous methods of placing a bar or coupling element between two adjacent square Lamé mode resonators.

Figure 2:
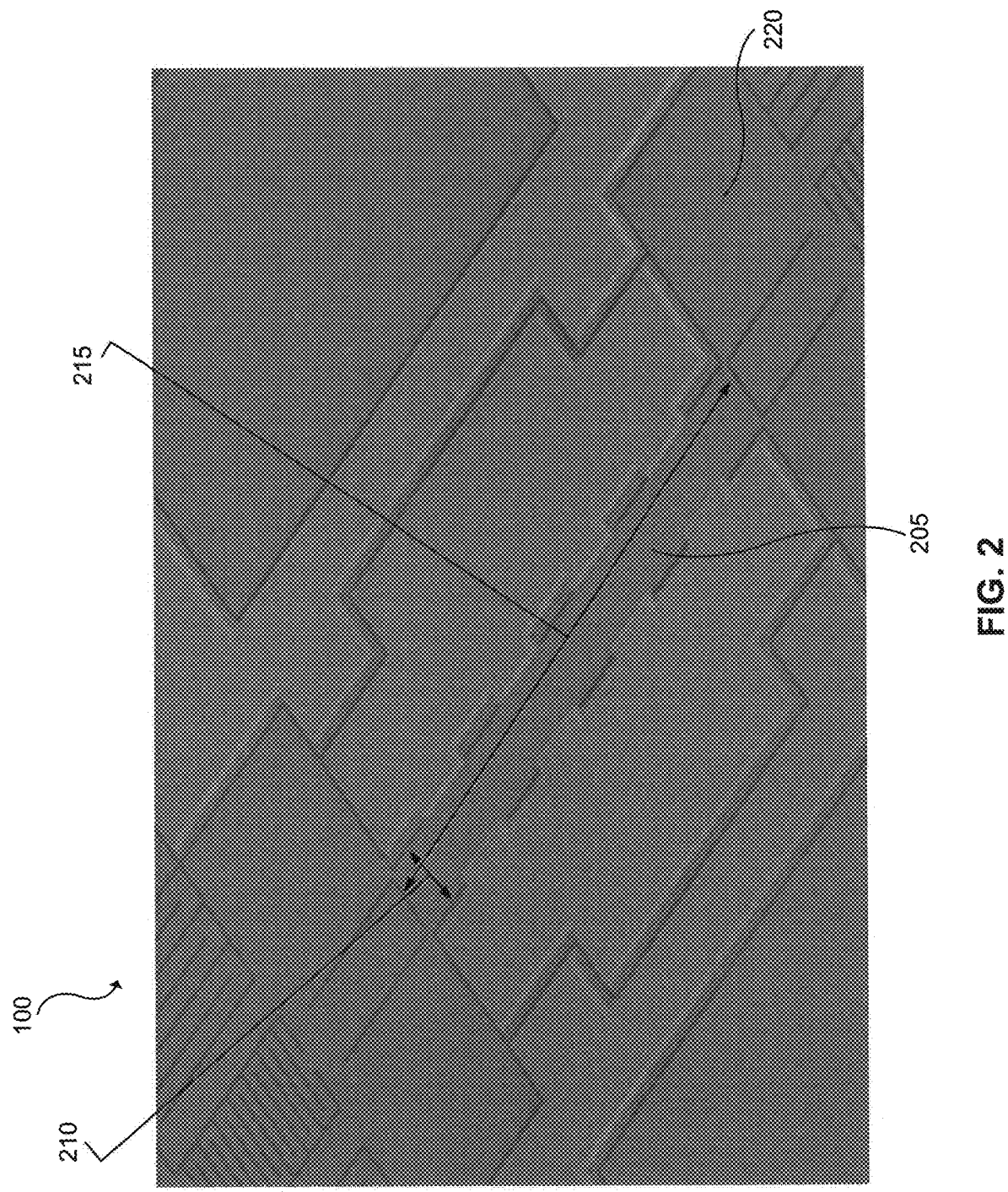
FIG. 2 depicts a resonator, according to an exemplary embodiment of the present disclosure.

FIG. 2 depicts an in-line DLR 100, according to an exemplary embodiment of the present disclosure. As shown in FIG. 2, one realization of a DLR 100 is a straight, or "beam," structure. In some embodiments, a DLR 100 may comprise an elongated resonator beam 205. As will be appreciated, the resonator beam 205 may be manufactured in whole or in part from a material with desired mechanical and piezoelectric properties for a resonator beam 205, for example and not limitation poly or mono-crystalline silicon, poly or mono-crystalline silicon carbide, poly or mono-crystalline diamond, silicon dioxide, silicon nitride, poly or mono-crystalline germanium, and glass. In some embodiments the resonator beam 205 may be rectangular in shape.

A resonator beam 205 comprises a width 210 and a length 215. The resonator width 210 may be within any range that provides a desired transduction area, Q factor, frequency, and/or any other desired attribute. For example, Equation 3 above describes the relationship between width, frequency, Q factor, and/or motional impedance for a given number (N) of electrode-pair-digits. In some embodiments, it is conceived that the resonator width 210 may be from between 0.1 µm and 100 µm; the resonator width 210 may be from between 0.1 µm and 80 µm; the resonator width 210 may be from between 0.1 µm and 60 µm; the resonator width 210 may be from between 0.1 µm and 40 µm; and the resonator width 210 may be from between 0.1 µm and 20 µm.

In a DLR 100, the resonator width 210 has an important relationship with the resonator length 215. As described above in FIG. 1, a propagating train of Lamé modes 105 includes a repeating series of single square Lamé modes 115. Therefore, for each unit of width 210, the DLR 100 can have a corresponding unit of length 215. This means that the length 215 of a DLR 100 is an integer multiple of the width 210. For example, if a DLR 100 has a width 210 of W, the DLR 100 can have at least a length 215 of (X+1)W, wherein X is a positive non-zero integer. (Note that a length of 1W would not create a distributed Lamé mode resonator. Such a configuration would be a conventional square Lamé mode resonator). In the example embodiment shown in FIG. 2, the length 215 of the resonator beam 205 is shown to be nine times (9W) the width 210 of the resonator beam 205, which is in accordance with some embodiments of the present disclosure. Any integer multiple of two or more is conceived. For example, a resonator beam 205 may have a length 215 hundreds of times greater than the width 210. In some embodiments, a DLR 100 may comprise a polarization voltage source 220.

Figure 3:
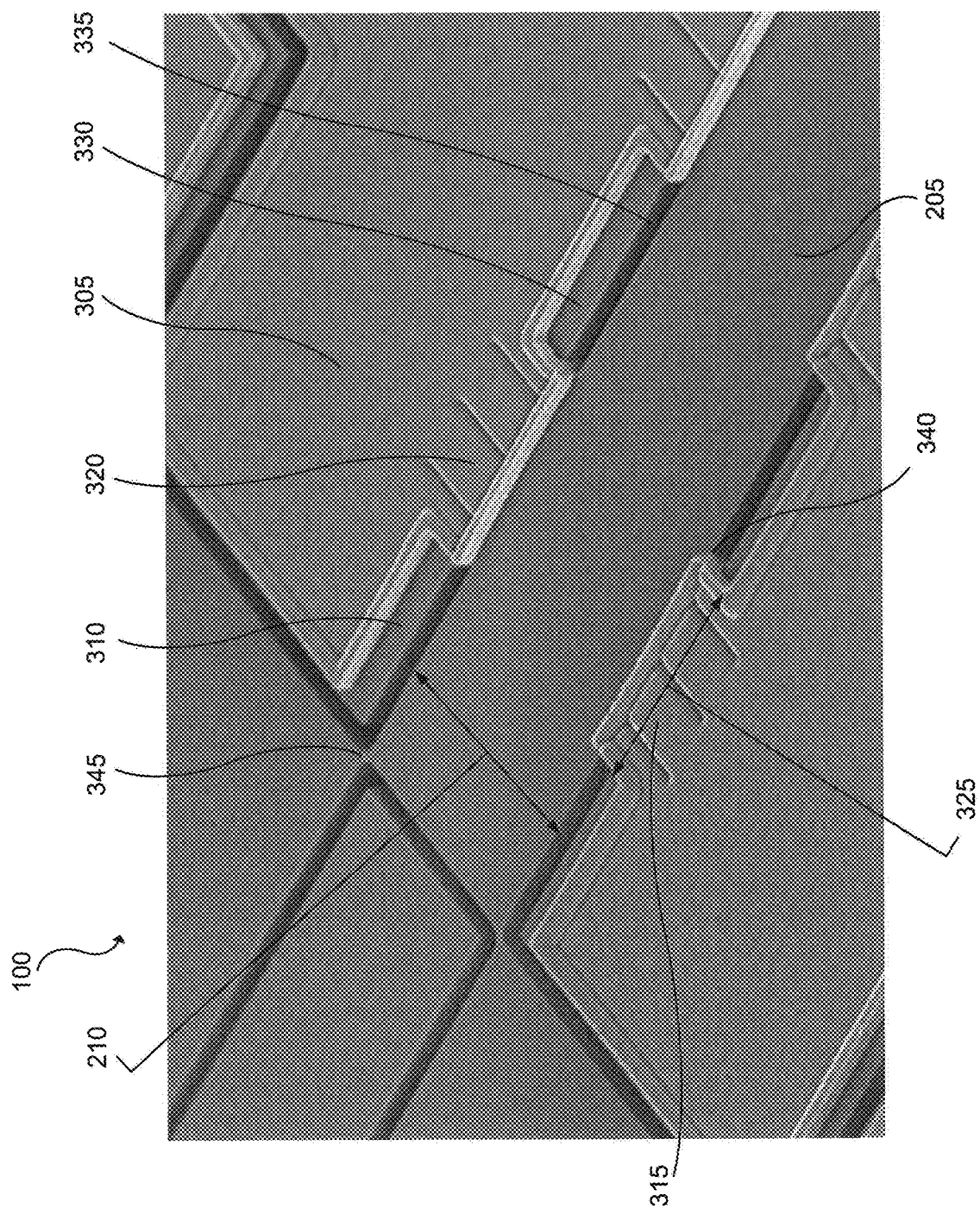
FIG. 3 is an enlarged view of a resonator, according to an exemplary embodiment of the present disclosure.

FIG. 3 depicts an enlarged view of the DLR 100 of FIG. 2, according to an exemplary embodiment of the present disclosure. In some embodiments, a DLR 100 may comprise an electrode plate 305 disposed on a body plate 310. In some embodiments, and as shown, the electrode plate 305 may include a series of drive electrodes 315 and/or sense electrodes 320. However, it is conceived that the electrodes 315/320 may not be drive/sense electrodes but are instead shorted to create a one-port configuration, i.e., both electrodes 315/320 acting as drive electrodes. In some embodiments the body plate 310 and the electrodes 315/320 (and electrode plate 305) may be manufactured from different substrates. For example and not limitation, the body plate 310 may be manufactured in whole or in part from silicon and the electrodes 315/320 may be manufactured in whole or in part from polysilicon. As will be appreciated, the components may be manufactured from other materials, and those materials are described herein and/or are known by a person having ordinary skill in the art of MEMS.

Each electrode 315/320 has an electrode width 325. The electrode width 325 has a relationship with the resonator width 210. As described above in FIG. 1, a propagating train of Lamé modes 105 includes a repeating series of single distributed elements, or single square Lamé modes 115. For example, along one edge of a resonator beam 205, a first square Lamé mode is expanding along that edge, a second square Lamé mode is contracting along that edge, a third square Lamé mode is expanding along that edge, and so forth along the length of the resonator beam 205. The electrode width 325, therefore, can be no greater than the width 210 of the beam 205, or else the electrode 315/320 would extend beyond a single distributed element (i.e., the electrode 315/320 would extend beyond a single square Lamé mode element). An electrode extending beyond a single distributed element would disrupt the sinusoidal pattern of the propagating train of Lamé modes 105.

Although an electrode 315/320 may not have a width 325 greater than the width 210 of the resonator beam 205, nothing requires that the width 325 be as wide as the resonator in the presently described systems. With conventional square Lamé mode resonators, an excitation force distributed across an entire side of the square device is desirable to achieve the full potential of the resonator. For example, an electrode covering most of a side of a square Lamé mode resonator helps drive the resonator into its distinctive extending/contracting shape. In the presently described systems, the excitation force is not provided by a single electrode along one side of a single square Lamé mode but is instead is provided by a series of multiple electrodes, which all contribute to drive the DLR 100 into its distinctive sinusoidal shape of alternating resonant units. Therefore, in some embodiments, a DLR 100 may have an electrode width 325 substantially smaller than the width 210 of the resonator beam 205. In some embodiments, the electrode width 325 is substantially equal to the width 210 of the resonator beam 205, as shown in the exemplary DLR 100 depicted in FIG. 3.

In some embodiments, each electrode 315/320 on one edge of a resonator beam 205 (e.g., all electrodes on a single electrode plate 305) may be electrically coupled such that the coupled electrodes all drive the resonator beam 205 at the same time across the same capacitance gap. For example, in FIG. 3, the view shows two drive electrodes (drive electrode 315 and the drive electrode below and to the right) along one edge of the resonator beam 205. In some embodiments, these two electrodes are spaced such that the two electrodes provide capacitance to two single distributed elements along the propagating train of Lamé modes 105 (shown in FIG. 1). In the embodiment shown in FIG. 3, this means that a single distributed element in the opposite configuration will be present between the two electrodes (i.e., if the two electrodes are driving their corresponding Lamé modes into a contracted state, between the two electrodes will be a single Lamé mode in its expanded state). In FIG. 3, this opposite, single distributed Lamé mode would be found along the resonator beam 205 in the area between two electrodes 330.

In some embodiments, instead of an area between two electrodes 330, an additional series of electrically-coupled electrodes may be placed in the system along the length of the resonator beam 205. This is particularly true because, as discussed above, the electrodes 315/320 in the presently disclosed systems are not required to be as wide as the resonator beam 205. This additional series of electrically-coupled electrodes may provide an opposite drive ac voltage to the resonator beam 205. For example, when the drive electrodes 315 are providing a positive ac drive voltage signal to the resonator, the additional series of electrodes will provide a negative ac drive voltage signal; when the drive electrodes 315 provide a negative ac drive voltage signal to the resonator, the additional series of electrodes provide a positive ac drive voltage signal. An embodiment with a series of positive/negative/positive electrodes may take advantage of the sinusoidal pattern of the propagating train of Lamé modes 105 (as shown in FIG. 1).

In some embodiments, a space 335 between the body plate 310 and resonator beam 205 may be provided as an area for the electrodes 315/320 to be disposed. In some embodiments, the electrodes 315/320 do not occupy the entire space 335 because a capacitive gap 340 is provided between the electrodes 315/320 and the resonator beam 205 (as will be discussed in more detail herein). In some embodiments, the resonator beam 205 is anchored to the body plate 310 at anchor points 345.

Figure 4A:
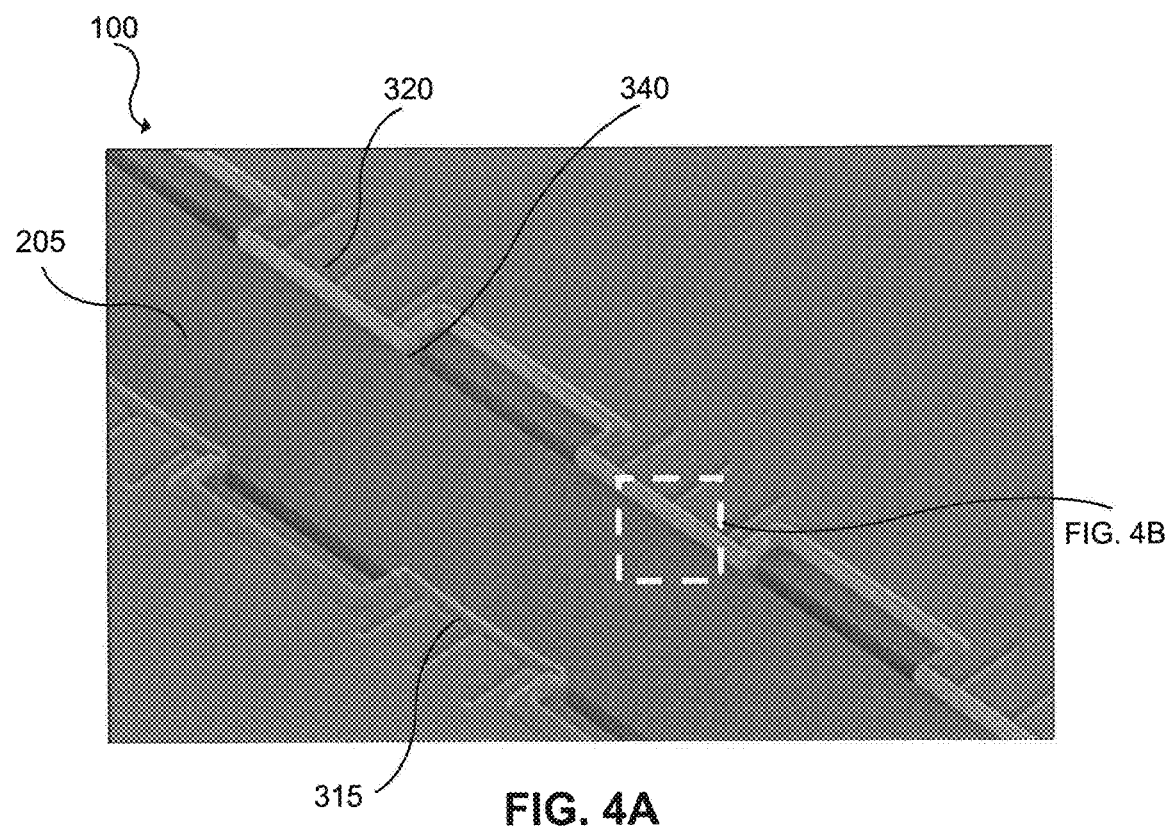
FIG. 4A depicts a resonator and highlights a capacitive gap between an electrode and a resonator beam, according to an exemplary embodiment of the present disclosure.
Figure 4B:
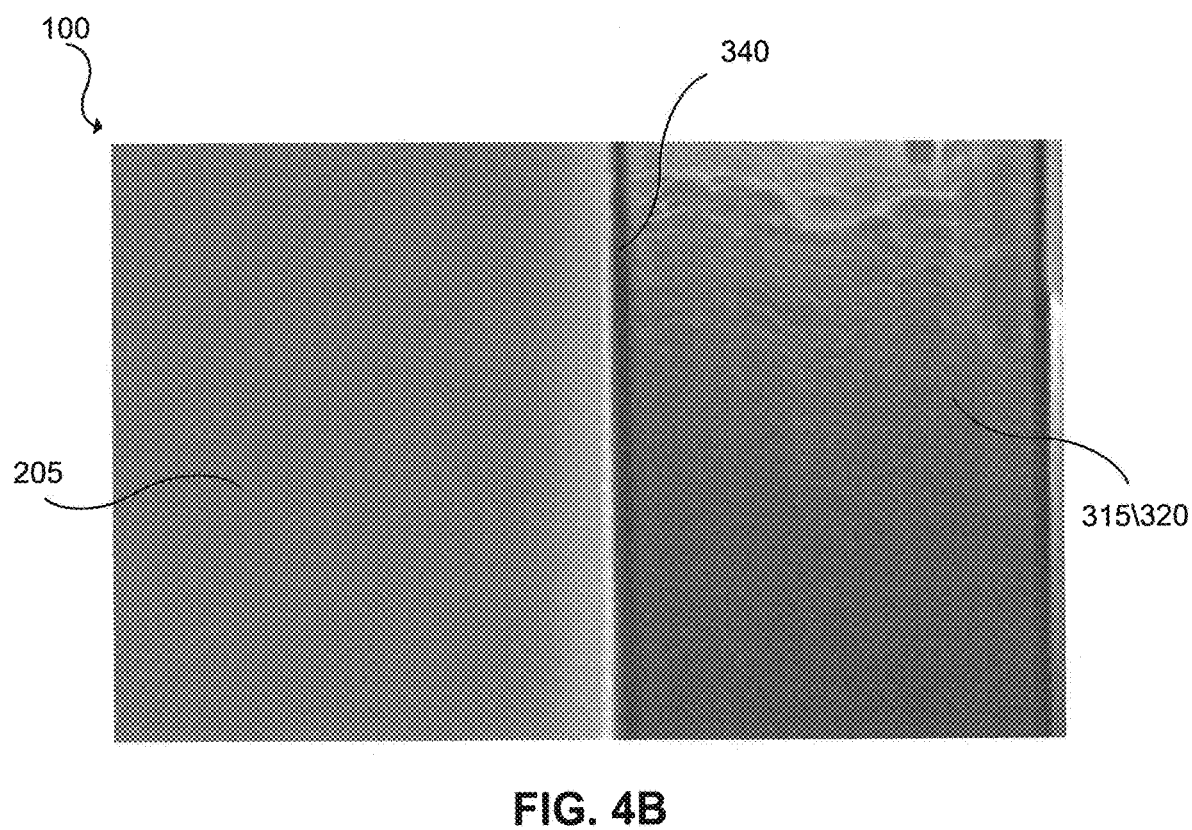
FIG. 4B is an enlarged cross-sectional view of a capacitive gap between an electrode and a resonator beam, according to an exemplary embodiment of the present disclosure.

FIG. 4A depicts a DLR 100, according to an exemplary embodiment of the present disclosure. FIG. 4A depicts an DLR 100 having a capacitive gap 340 between the electrodes 315/320 and the resonator beam 205. FIG. 4B is a blown-up detail of the capacitive gap 340, according to an exemplary embodiment of the present disclosure. Throughout this disclosure, the phrases "capacitive gap" and "capacitive space" may be used interchangeably, and both phrases refer to the area between an electrode and a resonator beam. In some embodiments, it is desirable to decrease the capacitive gap 340 between the electrodes 315/320 and the resonator beam 205. As seen in Equations 2 and 3 above, the motional impedance $R_m$ of a Lamé mode or DLR 100 increases with an increased capacitive gap 340 (referred to in the equation as capacitive gap g). However, with the presently described systems, the relationship between motional impedance and capacitive gap 340 size is compensated for by distributing the transduction across multiple electrodes 315/320. As a result, the capacitive gap 340 in the presently described systems may be much smaller than the capacitive gap in traditional Lamé mode resonators. Accordingly, the gap size may be selected based on any of the characteristics described herein. In some embodiments, the capacitive gap 340 may be from between 10 nm and 400 nm wide; the capacitive gap 340 may be from between 10 nm and 300 nm wide; the capacitive gap 340 may be from between 10 nm and 200 nm wide; the capacitive gap 340 may be from between 10 nm and 100 nm wide; the capacitive gap 340 may be from between 10 nm and 80 nm wide; the capacitive gap 340 may be from between 10 nm and 60 nm wide; the capacitive gap 340 may be from between 10 nm and 40 nm wide; the capacitive gap 340 may be from between 10 nm and 20 nm wide.

Figure 5:
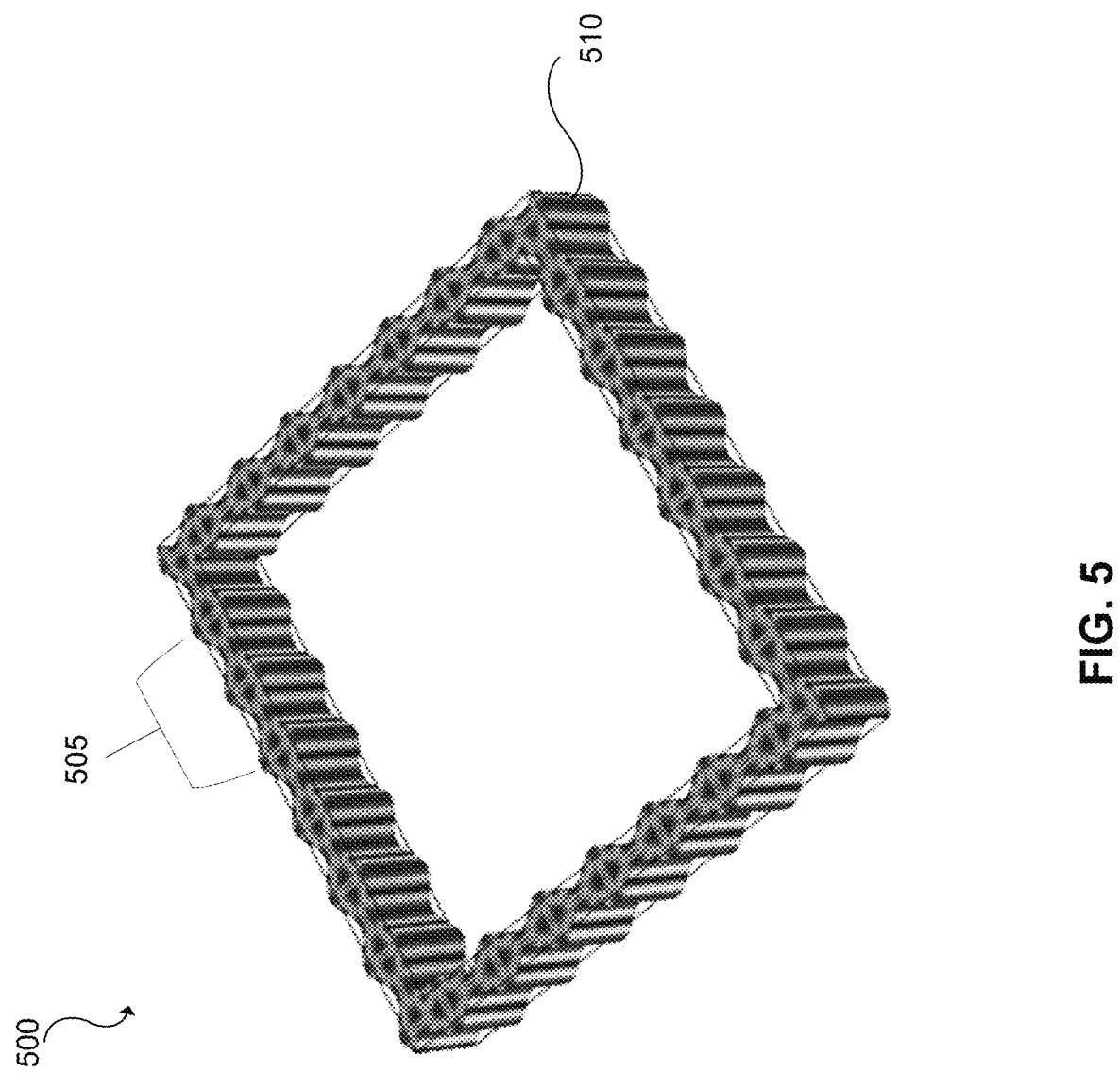
FIG. 5 depicts a propagating train of Lamé modes along a square-shaped frame resonator, according to an exemplary embodiment of the present disclosure.

FIG. 5 depicts how a DLR 500 may take advantage of a propagating train of Lamé modes 505 when placed in a frame configuration, in accordance with some embodiments of the present disclosure. In some embodiments, the same propagating train of Lamé modes can be utilized in a frame configuration. For example, the same in-line, or "beam," structure described above in FIGS. 1-4 may be configured to include multiple in-line DLRs connected at corners 510. As seen in FIG. 5, the same sinusoidal train of Lamé modes 505 exists along each side of the frame DLR 500, passing each corner 510 and continuing to the next in-line DLR. In some embodiments, the frame DLR may be square, as shown in FIG. 5. In some embodiments, the frame structure may comprise more than four in-line DLRs. For example, in some embodiments, the DLR may be a serpentine of more than four in-line DLRs as long as they are connected at an angle of 90° to each other.

Figure 6:
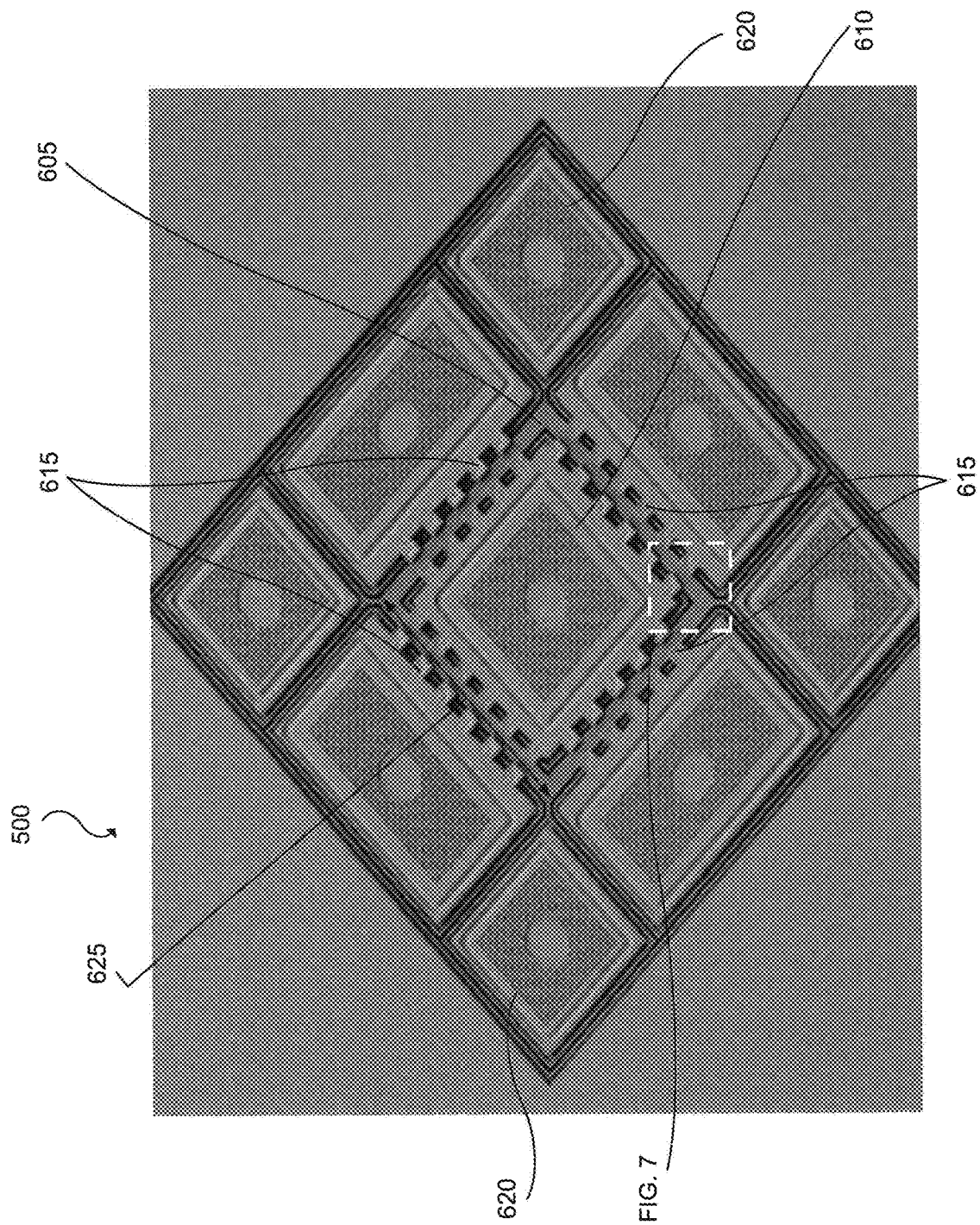
FIG. 6 depicts a square-shaped frame resonator, according to an exemplary embodiment of the present disclosure.

FIG. 6 depicts a view of a frame DLR 500, according to an exemplary embodiment of the present disclosure. A frame DLR 500 comprises a resonator beam 605 disposed along the DLR 500 in the shape of the system. Along the length of the resonator beam 605 is a series of electrodes, as described above. For example, in some embodiments a series of drive electrodes 610 may be disposed along the inner edges of the resonator beam 605. In some embodiments, a series of sense electrodes 615 may be disposed along the outer edges of the resonator beam 605. In some embodiments, the drive electrodes 610 may be on the outer edges and the sense electrodes 615 may be on the inner edges of the resonator beam 605. In some embodiments, the electrodes 610/615 may be shorted to create a one-port configuration, i.e., both electrodes 610/615 acting as drive electrodes. In some embodiments, a frame DLR 500 may comprise a polarization voltage source 620.

One benefit of a frame DLR 500 is providing a decreased footprint for DLRs with a great number of electrode pairs. As described above, it may be desirable to provide a DLR with a great number of electrode pairs, i.e., to scale up the frequency without increasing the motional impedance. The frame configuration allows a greater number of electrode pairs in a more compact system than an in-line, or "beam," system by turning the length of the resonator beam 605 at the corners of the frame structure.

Figure 7:
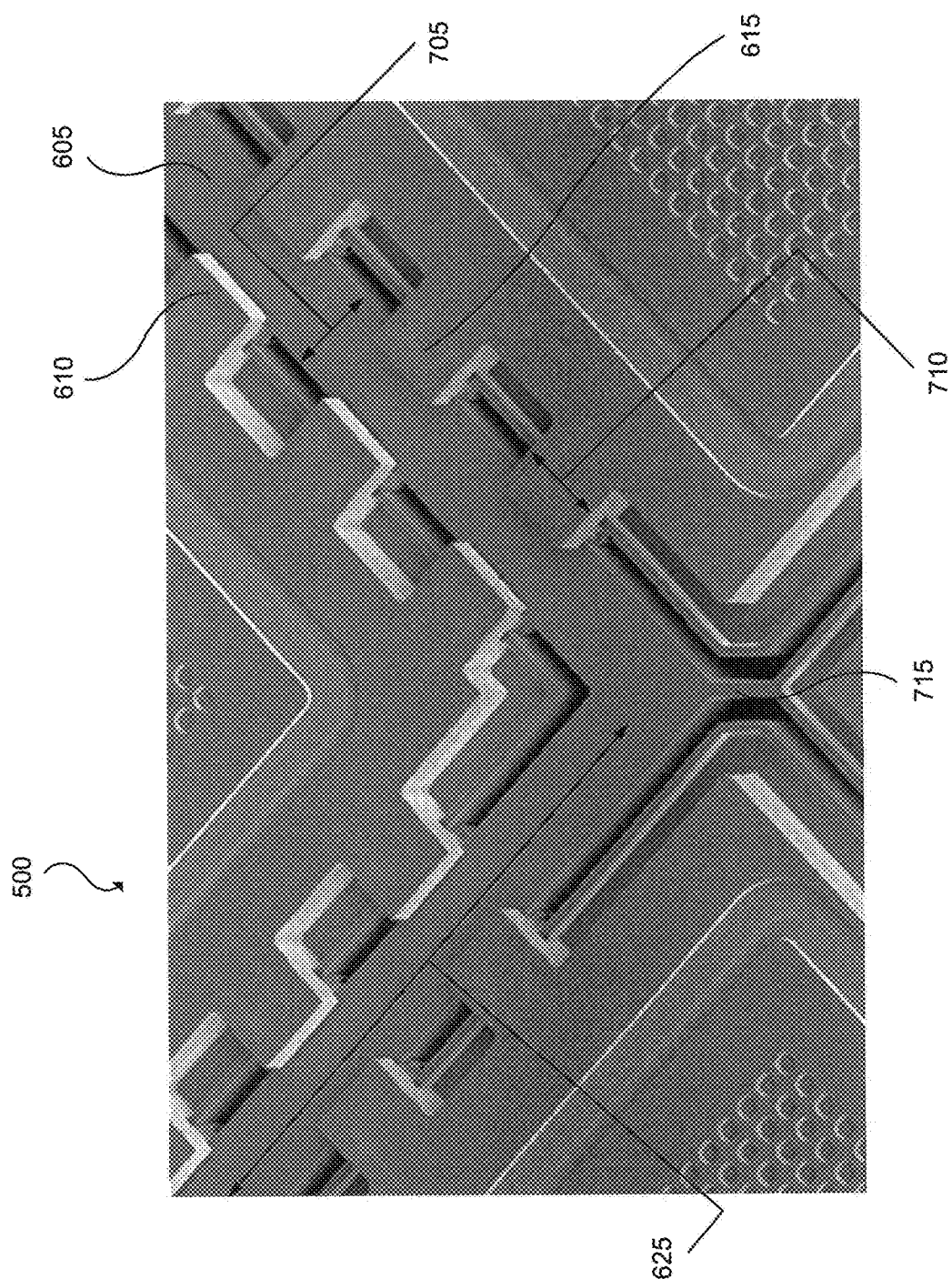
FIG. 7 is a detailed view of a square-shaped frame resonator, according to an exemplary embodiment of the present disclosure.

FIG. 7 is a blown-up detail of the frame DLR 500 depicted in FIG. 6, according to an exemplary embodiment of the present disclosure. A resonator beam 605 comprises a width 705 and a length 625 (the full length of the resonator beam 605 is shown in FIG. 6). The resonator width 705 may be within any range that provides a desired frequency for the resonator. The number of repeated electrodes 610/615 may be within any range that provide a desired transduction area, Q factor, frequency, and/or any other desired attribute. The resonator width 705 of a frame DLR 500 may be within any of the ranges described above for an in-line DLR (described in the discussion for FIG. 2). The resonator length 625 of a frame DLR 500 must also be an integer multiple of the resonator width 705, as described in detail herein.

The electrodes 610/615 in a frame DLR 500 also have the same width characteristics as described above for the in-line DLR 100. For example, the electrode width 710 in a frame DLR 500 must be no greater than the width 705 of the beam 605, or else the electrode 610/615 would extend beyond a single distributed element (or singe resonant Lamé-mode unit). In some embodiments, the resonator beam 605 is anchored to the frame DLR 500 at anchor points 715.

Figure 8:
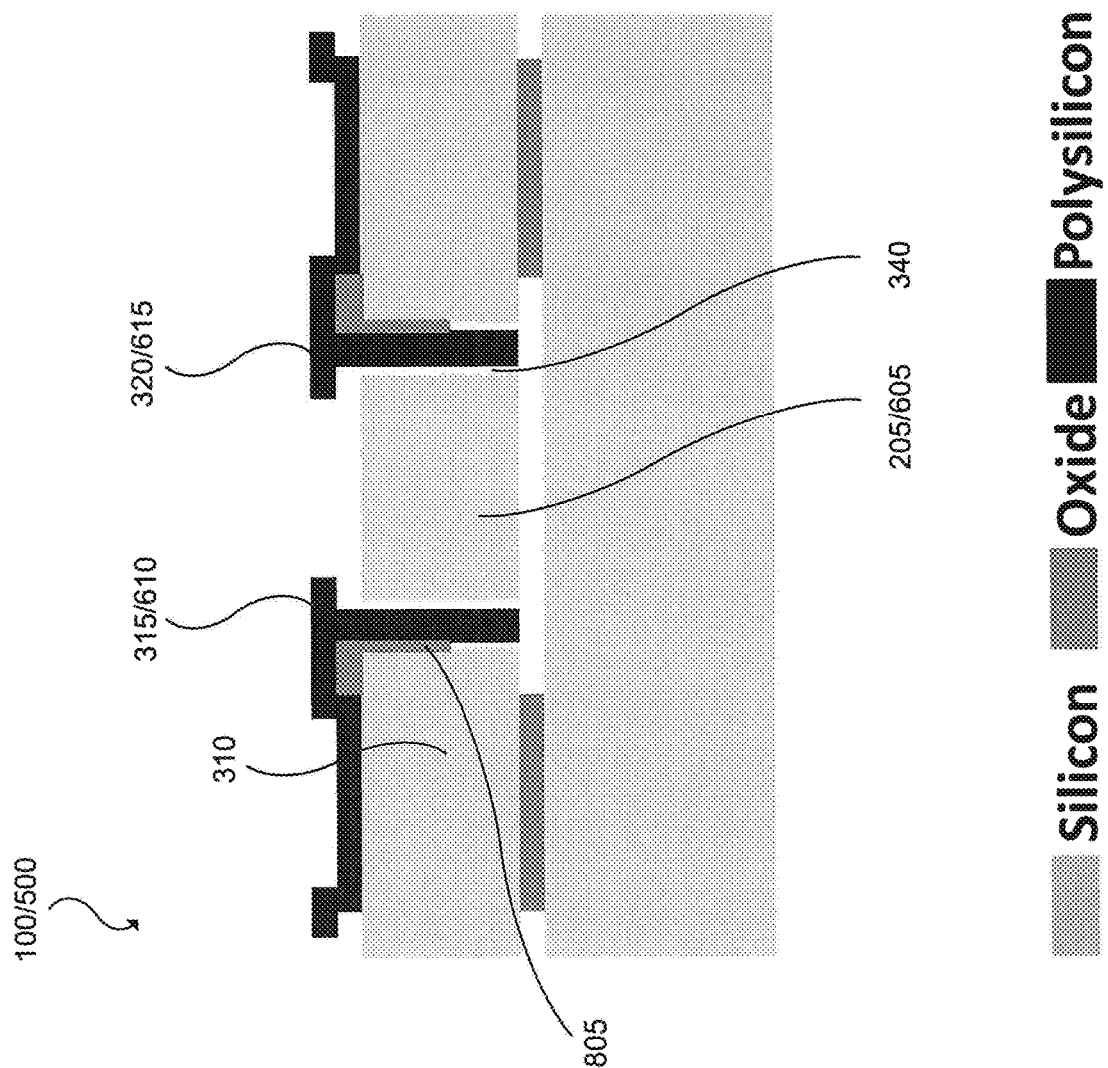
FIG. 8 is a cross-sectional view of a resonator, according to an exemplary embodiment of the present disclosure.

FIG. 8 depicts a cross-sectional view of a DLR 100/500, according to an exemplary embodiment of the present disclosure. In some embodiments, a gap 805 may be present between the electrodes (315/610/320/615) and the body plate 310. This gap 805 may provide a space to dispose an oxide pillar. The cross-sectional view in FIG. 6 also provides a visualization of the capacitive gap 340 between the electrodes (315/610/320/615) and the resonator beam 205/605.

Experimental Section

The following section discusses an experiment performed on two DLR devices, one in-line (or "beam") DLR and one frame DLR (in a square configuration as seen in FIG. 6). In the experiment, the beam DLR comprised a resonator beam width of 80 μm; the frame DLR comprised a resonator beam width of 20 μm. The two DLRs shared the same resonance frequency as would square resonators with the same side width (41 MHz and 167 MHz respectively). The length dimensions of the two DLRs were much larger than their square counterparts, providing large transduction areas. Table 1 provides the properties for both DLRs.

TABLE 1

| Dimension | Beam DLR | Frame DLR |
|---|---|---|
| Frequency (MHz) | 41 | 167 |
| Resonator Beam Width (μm) | 80 | 20 |
| Resonator Beam Length (μm) | 720 | 300 × 4 |
| Resonator Beam Thickness (μm) | 60 +/− 1 | 40 +/− 0.5 |
| Capacitive Gap size (nm) | 300 | 190 |
| Motional impedance (kΩ) | 80 | 3.5 |
| Doping level (cm$^{-3}$) | 5-7 × 10$^{19}$ | 1-2 × 10$^{18}$ |

Figure 9:
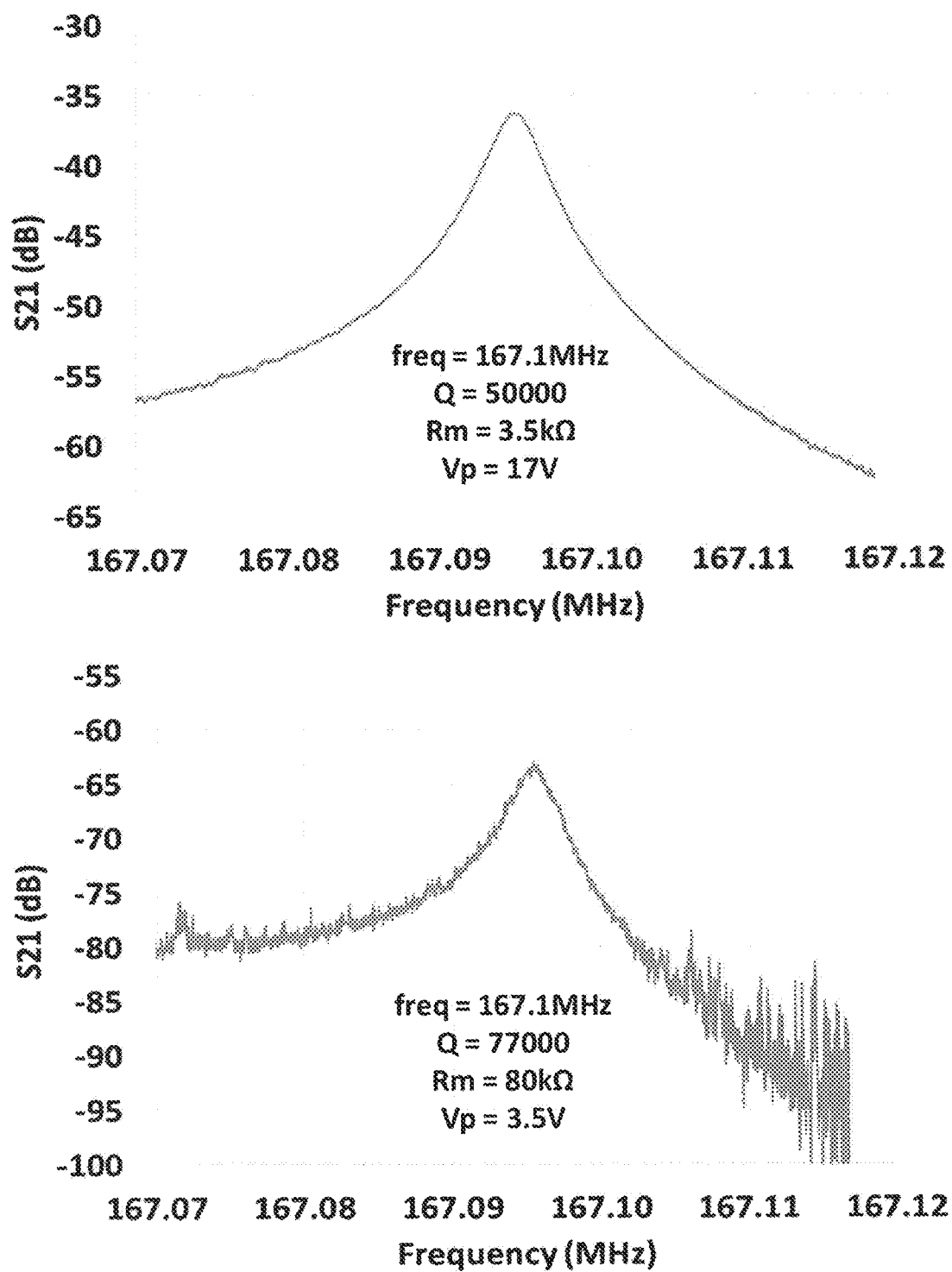
FIG. 9 is a graph of the resonance peaks of the distributed Lamé mode for a square-shaped frame resonator at different polarization voltages.

The results of the experiment on the frame DLR are shown in FIG. 9. The device is first characterized in a vacuum chamber at sub-mTorr pressure using a network analyzer. The frame DLR measures a motional impedance of 3.5 kΩ at a Vp of 17V, which corresponds to a low insertion loss of −36 dB. When being used to build oscillators, this low motional impedance and insertion loss will reduce the gain requirement on the amplifier circuits, making it more practical to achieve high oscillation frequencies. A Q of 77 k is measured on the same device for a Vp of 3.5V. The insertion loss is −64 dB ($R_m$ of 80 kΩ) which agrees with the Vp scaling, taking the f-Q to be as high as $1.3\times10^{13}$, which is among the highest f-Q products reported for silicon resonators. This shows that it is possible to go to much higher frequencies by using the DLR design while measuring a high Q at relatively low Vp and low motional impedance.

Figure 10:
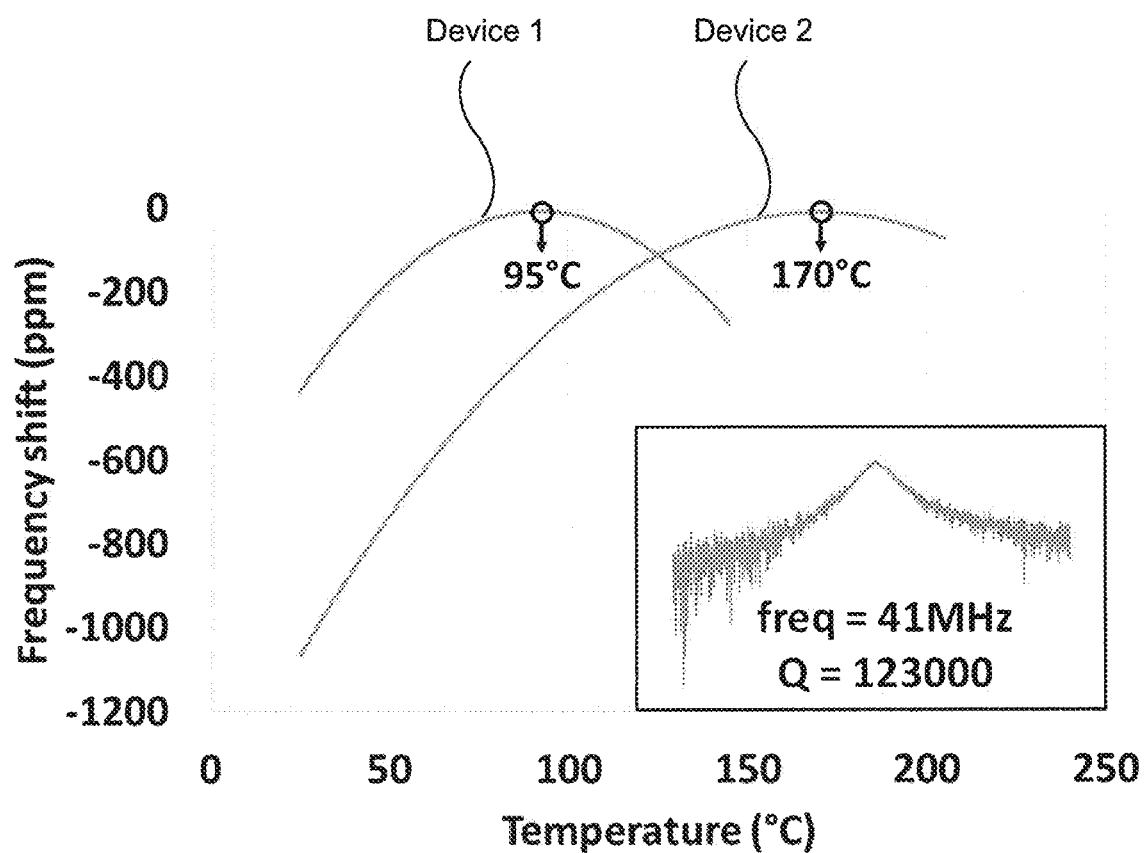
FIG. 10 is a frequency versus temperature graph showing the turnover points of the exemplary resonator for different doping concentrations and the resonance peak of the beam resonator.

FIG. 10 shows the frequency-temperature relation of two beam-DLR devices having doping concentrations of $5\times10^{19}$ and $7\times10^{19}$ cm$^{-3}$ for Device 1 and Device 2 respectively, and the resonance peak of the beam DLR is shown in the inset with a Q of 123,000 at 41 MHz. A quadratic temperature coefficient of frequency (TCF) profile is observed as expected, with the turnover points at 95° C. and 170° C. for the two devices. This is similar to the temperature-frequency relation of a single square Lamé mode resonator, thereby retaining its temperature characteristics in the DLR design. The TCF around the turnover point is close to zero, therefore ovenizing the device to maintain its temperature at the turnover point will allow one to build an extremely frequency stable oscillator that are suitable for high-frequency timing applications over a wide range of environment temperature.

The systems described herein provide a novel resonator design that makes use of the in-plane shear nature of Lamé mode, but instead the mode is distributed across a beam using a plurality of Lamé mode systems. The designs described provide the temperature stability of a conventional square Lamé mode resonators, owed to the quadratic TCF profile of both conventional square resonators and DLRs. This temperature stability in DLRs provides an opportunity to achieve ovenized high frequency silicon oscillators that cannot be realized with the current systems. Additionally, current Lamé mode silicon resonators operate in the order of 10s of MHz. As shown in the experimental results, certain embodiments of the systems described herein provide an opportunity to realize silicon resonators operating at resonant frequencies in the hundreds of MHz range, e.g., up to 30 GHz.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. A MEMS resonator comprising:
   a resonator beam
   electrically-coupled electrodes periodically-spaced about one of a first side and a second side of the resonator beam; and
   a capacitive gap between at least a portion of the electrically-coupled electrodes and the resonator beam;
   wherein at least one of the capacitive gaps is smaller than 400 nanometers; and
   wherein a length of the periodic space between adjacent electrodes is equal to about the width of the resonator beam.

2. The resonator of claim 1, wherein the resonator beam is a first resonator beam; and
   wherein the resonator further comprises:
   a second resonator beam mechanically-coupled to the first resonator beam;
   a third resonator beam mechanically-coupled to the second resonator beam; and
   a fourth resonator beam mechanically-coupled to the first and third resonator beams;
   wherein the first, second, third, and fourth resonator beams are arranged in a rectangular or square shape.

3. The resonator of claim 1, wherein the width of the resonator beam is equal to $$\frac{1}{f\sqrt{2}}v;$$

wherein f is equal to the frequency and v is equal to the acoustic velocity of an elastic shear wave travelling through a body of the resonator.

4. The resonator of claim 1, wherein at least one of:
   no electrode has a length greater than the width of the resonator beam;
   the resonator further comprises anchors positioned about corners of the resonator, wherein the anchors mechanically-coupling the resonator to a substrate;
   the resonator is configured to resonate at a frequency greater than 167 MHz upon application of an input signal;
   the resonator has a quality factor between 10,000 and 10,000,000;
   the resonator exhibits a turn-over point in its frequency versus temperature characteristic between minus 100 to positive 200 degrees centigrade, wherein the slope of the characteristic is near zero;
   the resonator beam has a length and a width, the length being an integer multiple of the width, the integer multiple being at least two;
   the resonator beam comprises at least one of poly- or mono-crystalline silicon, poly- or mono-crystalline silicon carbide, poly- or mono-crystalline diamond, silicon dioxide, silicon nitride, poly- or mono-crystalline germanium, and glass; or the resonator beam comprises resonant units, wherein each resonant unit has a length and a width each equal to the width of the resonator beam, and wherein each resonant unit configured to resonate in a Lame mode at the frequency upon application of the input signal.

5. The resonator of claim 1 further comprising anchors positioned about corners of the resonator, the anchors mechanically-coupling the resonator to a substrate;
wherein:
no electrode has a length greater than the width of the resonator beam;
the resonator has a quality factor between 10,000 and 10,000,000;
the resonator beam comprises at least one of poly- or mono-crystalline silicon, poly- or mono-crystalline silicon carbide, poly- or mono-crystalline diamond, silicon dioxide, silicon nitride, poly- or mono-crystalline germanium, and glass; and
the resonator exhibits a turn-over point in its frequency versus temperature characteristic between minus 100 to positive 200 degrees centigrade.

6. A MEMS resonator comprising:
a resonator beam having a length and a width, the length being an integer multiple of the width, the integer multiple being at least two; and
electrically-coupled electrodes periodically-spaced about one of a first side and a second side of the resonator beam;
wherein a length of the periodic space between adjacent electrodes is equal to about the width of the resonator beam.

7. The resonator of claim 6, wherein no electrode has a length greater than the width of the resonator beam.

8. The resonator of claim 6 further comprising a capacitive gap between at least a portion of the electrically-coupled electrodes and the resonator beam.

9. The resonator of claim 8, wherein at least one of the capacitive gaps is smaller than 400 nanometers.

10. The resonator of claim 6 further comprising anchors positioned about corners of the resonator, the anchors mechanically-coupling the resonator to a substrate.

11. The resonator of claim 6, wherein at least one of:
the resonator has a quality factor between 10,000 and 10,000,000; or
the width of the resonator beam is equal to $$\frac{1}{f\sqrt{2}}v,$$

wherein f is equal to the frequency and v is equal to the acoustic velocity of an elastic shear wave travelling through a body of the resonator.

12. The resonator of claim 6, wherein the frequency is between 30 MHz and 30 GHz.

13. The resonator of claim 6, wherein the resonator beam comprises at least one of poly- or mono-crystalline silicon, poly- or mono-crystalline silicon carbide, poly- or mono-crystalline diamond, silicon dioxide, silicon nitride, poly- or mono-crystalline germanium, and glass.

14. The resonator of claim 6, wherein the resonator exhibits a turn-over point in its frequency versus temperature characteristic between minus 100 to positive 200 degrees centigrade; and wherein the slope of the characteristic is near zero.

15. The resonator of claim 6, wherein:
the resonator beam is a first resonator beam;
the electrically-coupled electrodes are first electrically-coupled electrodes;
the resonator further comprises:
a second resonator beam mechanically-coupled to the first resonator beam; and
second electrically-coupled electrodes periodically-spaced about one of a first side and a second side of the second resonator beam;
a length of the periodic space between adjacent:
first electrodes is equal to about the width of the first resonator beam;
second electrodes is equal to about the width of the second resonator beam; or
first electrodes is equal to about the width of the first resonator beam, and the length of the periodic space between adjacent second electrodes is equal to about the width of the second resonator beam;
no first electrode has a length greater than the width of the first resonator beam;
no second electrode has a length greater than the width of the second resonator beam;
the width of each resonator beam is equal to $$\frac{1}{f\sqrt{2}}v;$$

f is equal to the frequency and v is equal to the acoustic velocity of an elastic shear wave travelling through a body of the resonator;
each resonator beam comprises resonant units;
each respective resonant unit has a length and a width each equal to the width of the respective resonator beam; and
each resonant unit is configured to resonate in a Lame mode at the frequency upon application of the input signal.

16. A MEMS resonator comprising:
a first resonator beam;
a second resonator beam;
first electrically-coupled electrodes periodically-spaced about one of a first side and a second side of the first resonator beam; and
second electrically-coupled electrodes periodically-spaced about one of the first side and the second side of the second resonator beam;
wherein:
a length of the periodic space between adjacent first electrodes is equal to about the width of the first resonator beam;
a length of the periodic space between adjacent second electrodes is equal to about the width of the second resonator beam; or
the length of the periodic space between adjacent first electrodes is equal to about the width of the first resonator beam, and the length of the periodic space between adjacent second electrodes is equal to about the width of the second resonator beam.

17. The resonator of claim 16, wherein the second electrically-coupled electrodes are electrically isolated from the first electrically-coupled electrode; and wherein at least one of:
no first electrode has a length greater than the width of the resonator beam; or
no second electrode has a length greater than the width of the resonator beam.

18. A MEMS resonator comprising:
a first resonator beam having a length and a width, the length being an integer multiple of the width, the integer multiple being at least two; and
first electrically-coupled electrodes periodically-spaced about one of a first side and a second side of the first resonator beam;
wherein the first resonator beam comprises first resonant units, each having a length and width;
wherein each of the first electrically-coupled electrodes have a length less than or equal to the width of the first resonator beam;
wherein the resonator is configured to resonate at a frequency greater than 167 MHz upon application of an input signal;
wherein each of the first resonant units is configured to resonate in a Lame mode at the frequency upon application of the input signal to the resonator; and
wherein a length of the periodic space between adjacent first electrodes is equal to about the width of the first resonator beam.

19. The resonator of claim 18 further comprising:
a second resonator beam having a length and a width, the length being an integer multiple of the width, the integer multiple being at least two; and
second electrically-coupled electrodes periodically-spaced about one of a first side and a second side of the second resonator beam;
wherein the second resonator beam comprises second resonant units, each having a length and width;
wherein each of the second electrically-coupled electrodes have a length less than or equal to the width of the second resonator beam;
wherein a first end of the first resonator beam is mechanically-coupled to a first end of the second resonator beam, such that the first and second resonator beams are arranged non-linearly with respect to each other;
wherein each of the second resonant units is configured to resonate in a Lame mode at the frequency upon application of the input signal to the resonator; and
wherein:
a length of the periodic space between adjacent second electrodes is equal to about the width of the second resonator beam; or
the length of the periodic space between adjacent first electrodes is equal to about the width of the first resonator beam, and the length of the periodic space between adjacent second electrodes is equal to about the width of the second resonator beam.

20. The resonator of claim 19, wherein the first electrically-coupled electrodes are electrically-coupled to the second electrically-coupled electrodes.

* * * * *